United States Patent
Kumar

[11] Patent Number: 5,764,085
[45] Date of Patent: Jun. 9, 1998

[54] METHOD AND APPARATUS FOR SHARING A FET BETWEEN A PLURALITY OF OPERATIONALLY EXCLUSIVE LOGIC GATES

[75] Inventor: Ashok Kumar, Fort Collins, Colo.

[73] Assignee: Hewlett-Packard Company, Palo Alto, Calif.

[21] Appl. No.: 904,244

[22] Filed: Jul. 31, 1997

Related U.S. Application Data

[63] Continuation of Ser. No. 608,234, Feb. 28, 1996, abandoned.

[51] Int. Cl.$^6$ ..................... H03K 19/084; H03K 19/094
[52] U.S. Cl. ..................... 326/108; 326/103; 326/121; 326/47
[58] Field of Search ..................... 326/121, 38, 112, 326/103, 47, 106, 108

[56] References Cited

U.S. PATENT DOCUMENTS

| | | | |
|---|---|---|---|
| 4,275,316 | 6/1981 | Knapp | 307/279 |
| 4,684,829 | 8/1987 | Uratani | 326/106 |
| 5,039,886 | 8/1991 | Nakamura et al. | 326/17 |
| 5,066,996 | 11/1991 | Hara | 357/43 |
| 5,274,278 | 12/1993 | Bauer et al. | 326/106 |
| 5,309,043 | 5/1994 | Murahashi | 326/121 |
| 5,387,827 | 2/1995 | Yokoyama et al. | 326/106 |
| 5,391,941 | 2/1995 | Landry | 326/106 |

OTHER PUBLICATIONS

Weste et al., "Principles of CMOS VLSI, A Systems Perspective", copyright 1985 by AT&T Bell Laboratories, Inc. and Kamran Eshraghian, pp. 196–201, 1985.

*Primary Examiner*—Edward P. Westin
*Assistant Examiner*—Richard Roseen

[57] ABSTRACT

Method and apparatus for exploiting exclusivity of operation between a plurality of logic gates. The apparatus comprises a circuit having a plurality of logic gates. Each logic gate comprises a unique control input, and shares a data input with each of the plurality of logic gates. Control signals received at the control inputs insure exclusivity of operation between the logic gates. The shared data input is coupled to a shared fet which may serve as a virtual power supply for each of the plurality of logic gates.

5 Claims, 7 Drawing Sheets

METHOD AND APPARATUS FOR SHARING A FET BETWEEN A PLURALITY OF OPERATIONALLY EXCLUSIVE LOGIC GATES

CROSS REFERENCE TO RELATED APPLICATIONS

This is a continuation of application Ser. No. 08/608,234 filed on Feb. 28, 1996, now abandoned.

BACKGROUND OF THE INVENTION

The invention pertains to a method and apparatus for sharing a fet (field effect transistor) between a plurality of operationally exclusive logic gates. More specifically, when a plurality of fets sharing a common gate signal exist within a plurality of logic gates, and only one of the logic gates is operational at any given instant, the plurality of fets may be replaced with a single fet which is shared between the plurality of logic gates.

The invention is particularly advantageous with respect to dumper circuits. A dumper circuit is pictured in FIG. 1. In general, a dumper circuit is used to dump a stored value onto a bus. Multiple dumper circuits may be connected to a single bus, but only one of the circuits will drive the bus at a time. Such circuits are often used in RISC (reduced instruction set computer) systems to dump an instruction (a stored value; data) to one of two buses. The buses are commonly known as the launch bus and the retire bus. The launch bus is used to transfer an unexecuted instruction to an execution unit. The retire bus is used to clear an already executed instruction from the system.

Figure 1:
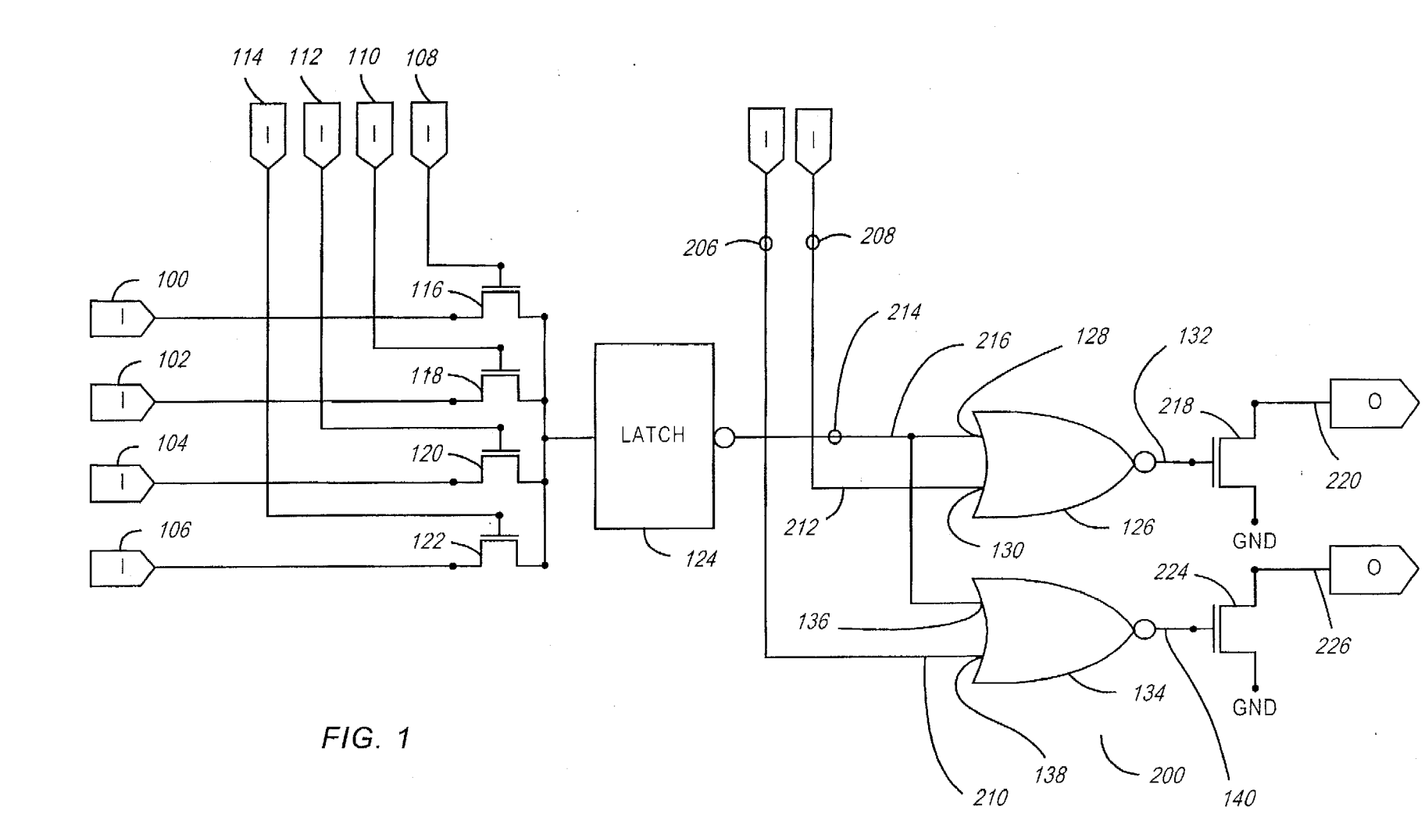
FIG. 1 is a gate level schematic of a first dumper circuit.

The dumper circuit of FIG. 1 comprises two NOR gates. Each NOR gate has a input. A single instruction bit stored by a latch (in this case, a four-input inverting latch) is fed to the shared data input. The latch is set by conventional setting logic. A control line is connected to the control input of each NOR gate. The control lines for the two NOR gates cannot be LO simultaneously (both can be HI, but when one goes LO, the other must be HI). Thus, when one of the control lines goes LO, an instruction bit appearing at the first NOR gate's data input will be transmitted to the launch bus, and when the other control line goes LO, an instruction bit appearing at the second NOR gate's data input will be transmitted to the retire bus.

Previous implementations of the above circuit have required an independent fet implementation for each of the NOR gates. In a conventional microprocessor, several instances of the circuit shown in FIG. 1 might exist. Since the two logic gates operate under mutually exclusive conditions, and are structurally identical, it would be advantageous to share structure between the two logic gates. A sharing of similar structures would result in 1) greater power savings (since it takes less power to operate one fet than it does to operate two or more fets), and 2) increased logic density (if similar structures can be shared, several partial logic gates sharing common components could be built—and partial logic gates require less physical space on a microprocessor chip than complete logic gates).

It is therefore a primary object of this invention to provide a method and apparatus for sharing a fet between a plurality of operationally exclusive logic gates.

It is another object of this invention to provide a method and apparatus which allow for increased logic density within a microprocessor.

It is a further object of this invention to provide a method and apparatus which result in increased power savings.

It is yet another object of this invention to provide a method and apparatus which allow for the building of higher speed circuits.

SUMMARY OF THE INVENTION

In the achievement of the foregoing objects, the inventor has devised a circuit comprising a plurality of operationally exclusive logic gates. Each logic gate has a unique control input, but shares a data input with the other logic gates. The shared data input is coupled to a shared fet which may serve as a virtual power supply for each of the plurality of logic gates.

By reducing the number of fets required to implement the plurality of logic gates, power dissipation is decreased, and less physical space is required to implement the circuit.

If a higher speed circuit is desired, increased power and additional space resulting from the shared fet implementation may be sacrificed in return for a larger shared fet which can operate at a faster speed.

These and other important advantages and objectives of the present invention will be further explained in, or will become apparent from, the accompanying description, drawing and claims.

BRIEF DESCRIPTION OF THE DRAWINGS

An illustrative and presently preferred embodiment of the invention is illustrated in the drawing in which.

DESCRIPTION OF THE PREFERRED EMBODIMENT

Figure 2:
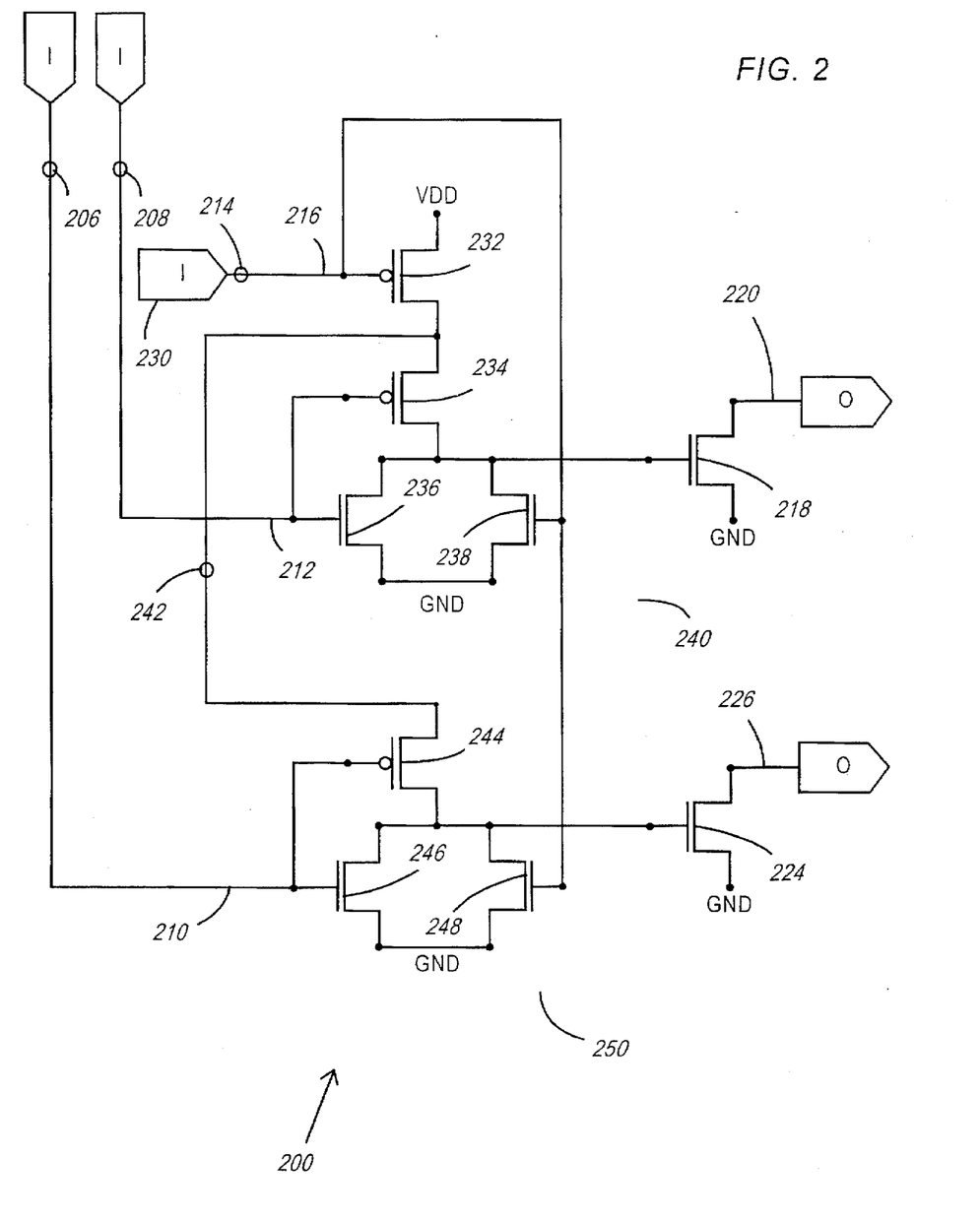
FIG. 2 is a fet level schematic of the FIG. 1 dumper circuit.
Figure 7:
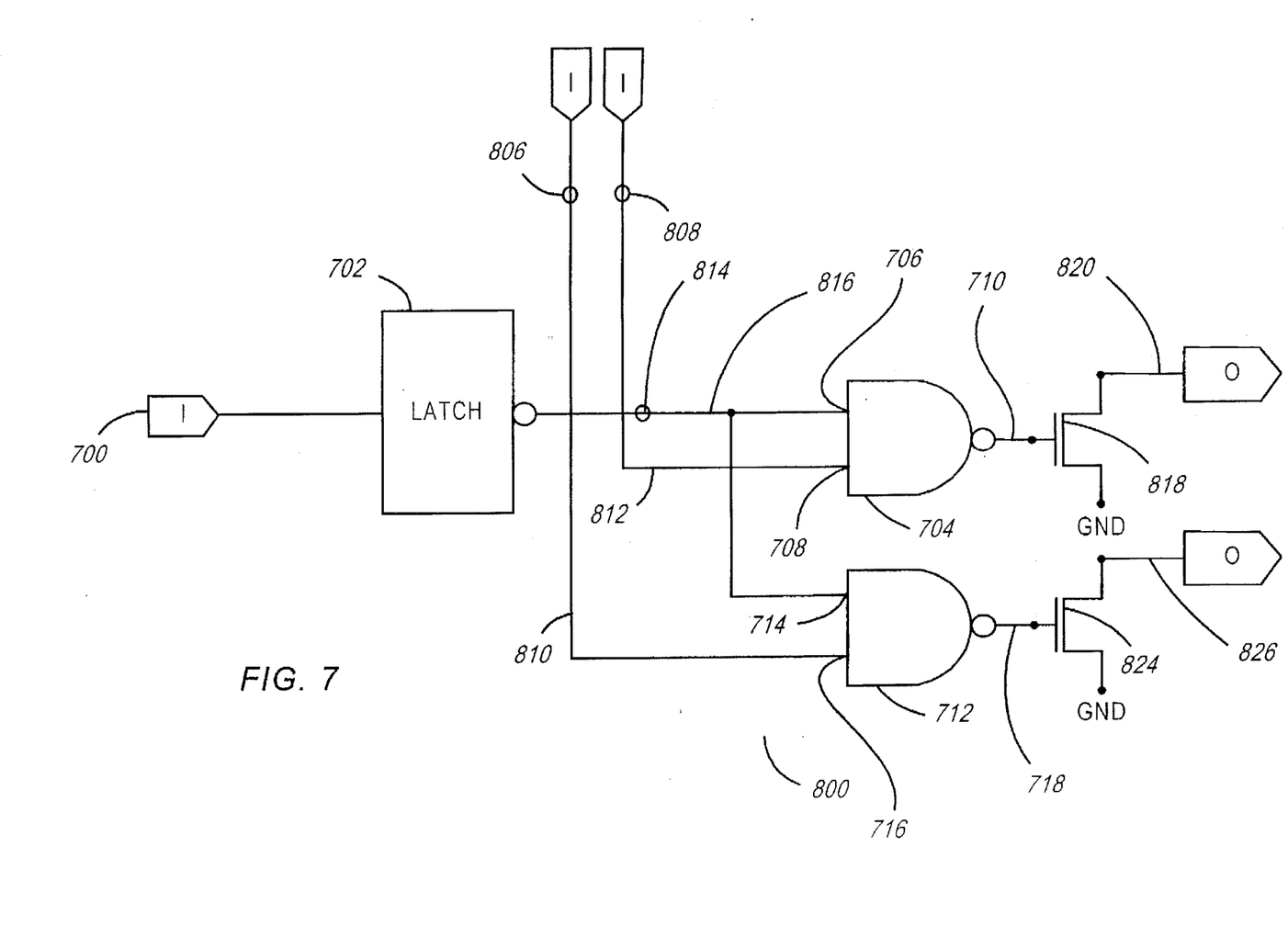
FIG. 7 is a gate level schematic of a second dumper circuit.
Figure 8:
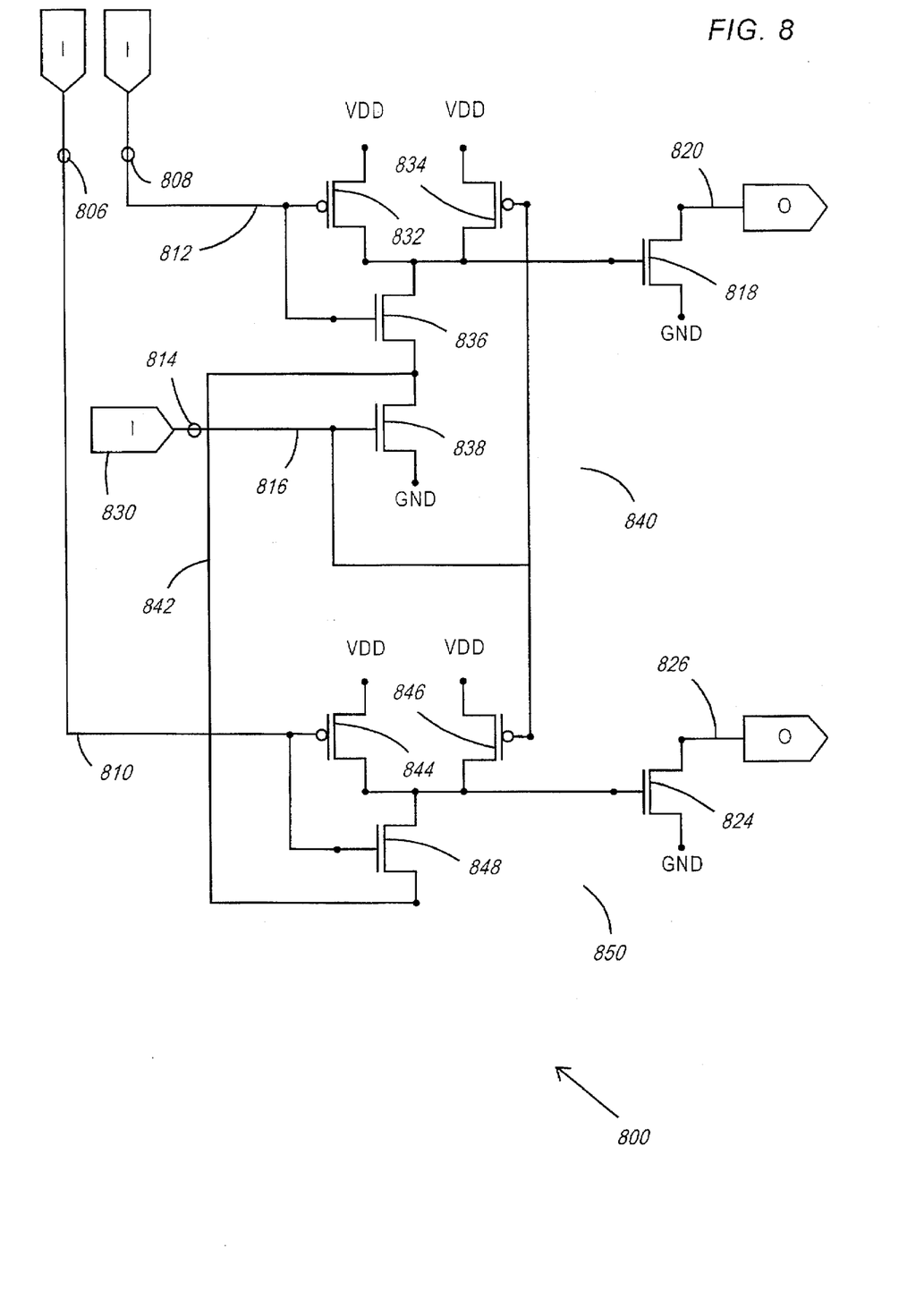
FIG. 8 is a fet level schematic of the FIG. 7 dumper circuit.

Circuits for dumping bits of a microprocessor instruction 216, 816 to one of two or more buses 220, 226, 820, 826 are pictured in FIGS. 1 & 2 and 7 & 8. The circuits 200, 800 may generally comprise a plurality of buses comprising at least first 220, 820 and second 226, 826 buses, a dumper circuit 200, 800 comprising a plurality of logic gates 126, 134, 704, 712, a plurality of operationally exclusive control lines 208, 206, 808, 806, and a data latch 124, 702 for storing a bit of a computer instruction. As illustrated in FIGS. 2 & 8, each dumper circuit 200, 800 comprises at least first 126, 704 and second 134, 712 logic gates. The first 126, 704 and second 134, 712 logic gates each comprise a unique control input 130, 138, 708, 716, but share a data input 128/136, 706/714. Each shared data input 128/136, 706/714 is coupled to a shared fet 232, 838 (field effect transistor).

Having thus described the dumper circuits 200, 800 in general, the circuits 200, 800 will now be described in further detail.

Figure 3:
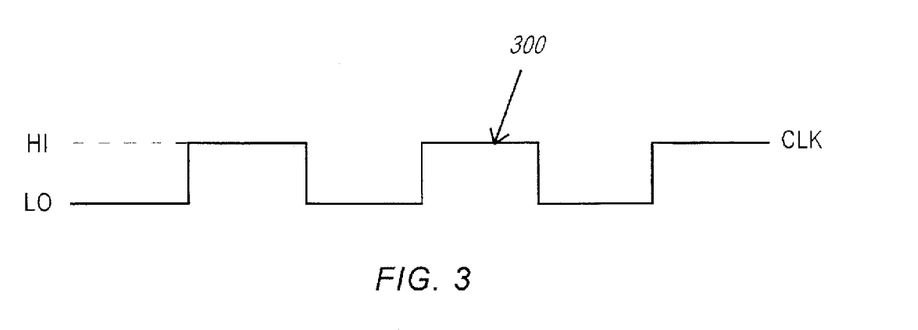
FIG. 3 shows a standard clock signal used to time the circuit of FIG. 2.

A first preferred embodiment of a dumper circuit 200 comprises two NOR logic gates 126, 134 (FIG. 1). An input 130, 138 of each logic gate 126, 134 is connected to a control line 208, 206. The two control lines 208, 206 are synchronized with a clock signal 300 (FIG. 3) and are timed to insure exclusive operation of the two logic gates 126, 134.

In other words, when one of the control lines 208 goes LO, the other 206 must be HI, and vice versa, such that only one of the NOR gates 126, 134 will generate an output 132, 140 at any given point in time.

The output 132, 140 of each NOR gate 126, 134 is connected to a bus 220, 226. The output 132 of one of the NOR gates 126 is connected to a launch bus 220 via an nfet 218 (n-type fet), and the output 140 of the other NOR gate 134 is connected to a retire bus 226 via an additional nfet 224. Thus, when an instruction is to be executed by a microprocessor, it may be dumped to the launch bus 220. When an executed instruction is to be cleared, it may be dumped to the retire bus 226.

Data 216 representing the instruction to be dumped appears at a shared data input 128/136 of the NOR gates 126, 134. The data is received by the shared data input 128/136 via a data line 214 connected to a four-input inverting latch 124. The latch 124 is capable of storing an instruction until it can be launched or retired. The latch is set by conventional means. In FIG. 1, the means comprises a plurality of nfets 116, 118, 120, 122 connected to the latch 124 via their drains. Their sources are connected to various data inputs 100, 102, 104, 106, and their gates are responsive to setting logic 108, 110, 112, 114. When a setting signal 108, 110, 112, 114 drives the gate of one of the nfets 116, 118, 120, 122 HI, a corresponding data input 100, 102, 104, 106 transmits an instruction to the latch 124, where it is stored until it is either launched or retired.

Figure 4:
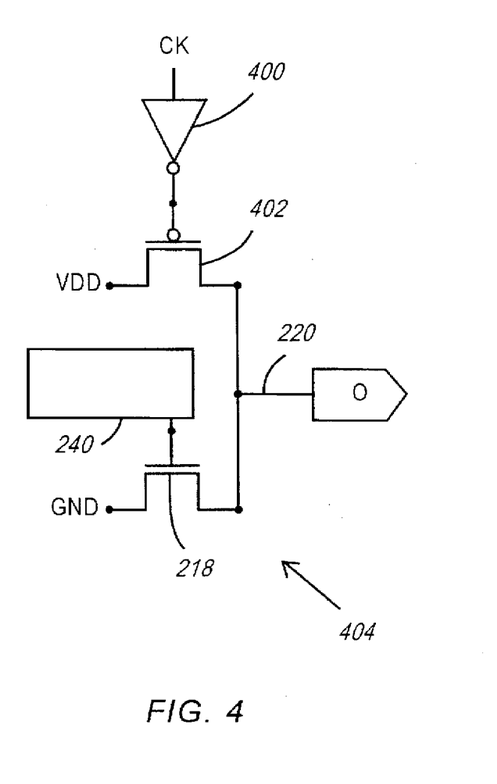
FIG. 4 shows a precharger circuit for a first bus in FIG. 2.
Figure 5:
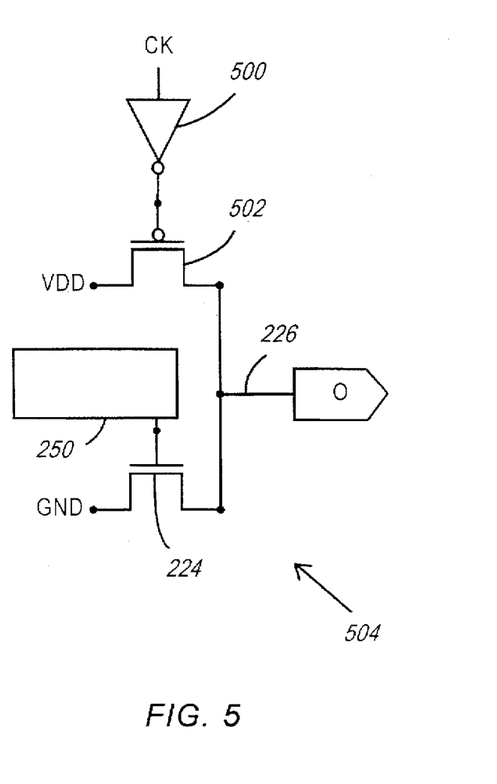
FIG. 5 shows a precharger circuit for a second bus in FIG. 2.

Each bus line 220, 226 is implemented as a precharge/pulldown line. For clarity, the preferred precharge architecture 404, 504 for the launch 220 and retire 226 buses is not shown in its entirety in the schematic of FIG. 2, but instead, is shown in FIGS. 4 and 5, respectively. Each precharger 404, 504 comprises a pullup fet 402, 502 (a p-type fet, or pfet) connected via its drain to one of the buses 220, 226. The sources of the pullup fets 402, 502 are connected to power (VDD), and their gates are connected to an inverted clock signal 400, 500. The pullup fets 402, 502 hold the buses HI until the simultaneous presence of data 216 and a control signal 212, 210 at a logic gate's inputs, 128 & 136 or 130 & 138, drives the output 132, 140 of that logic gate 126, 134 HI, thereby causing an nfet 218, 224 to drive its associated bus 220, 226 LO. After an instruction bit 216 has been transmitted over a LO bus 220, 226, the next pulse of the clock 300 will again drive the buses 220, 226 HI.

The dumper circuit 200 pictured in the gate level schematic of FIG. 1 is shown in greater detail in the fet level schematic of FIG. 2. The NOR gate 126, 240 of FIG. 1 which is used to dump an instruction to the launch bus 220 is implemented with fets 232, 234, 236, 238 using standard NOR architecture (two series pfets 232, 234 connected to two parallel nfets 236, 238 between power and ground). Data 216 received by the NOR gate's data input 128 drives the gate of the series pfet 232 connected to power (VDD), causing the pfet 232 to conduct. The drain of the conducting pfet 232 serves as a virtual power source for the second series pfet 234. When data 216 is present at the gate of the first series pfet 232, and a control signal 212 (LO signal) is received at the gate of the second series pfet 234, the launch bus 220 is pulled LO by pulldown fet 218, and an instruction dump occurs.

The NOR gate 134 of FIG. 1 which is used to dump an instruction to the retire bus 226 is implemented as a partial NOR fet structure 250 in FIG. 2. The partial structure 250 comprises a single pfet 244 which is connected to two parallel nfets 246, 248 tied to ground. Data 216 is input to the partial NOR fet structure 250 via a connection 242 to the power-connected series pfet 232 of the complete NOR structure 240. Since exclusivity of operation between the NOR gates 126, 134 is ensured by the signals 212, 210 received over the control lines 208, 206, the pfet connected to power may be shared between the NOR logic gates 126, 134, and the second NOR gate 134 does not need to be implemented as an independent structure. The shared pfet 232 will serve as a virtual power supply for the partial NOR structure 250, and the similar structure which is contained in the complete NOR structure 240.

It should be noted that the shared pfet 232 only serves as a virtual power supply when a stable data signal 216 is received over the logic gate's shared data line 214. One skilled in the art of circuit design may easily time the circuit 200 to ensure that a control signal 212, 210 is only received at a control input 130, 138 when stable data 216 is received at a data input 128, 136.

It is apparent from the drawings that use of a shared fet 232 implementation reduces the number of fets required to implement a circuit, and consequently, the chip area which is required to implement the circuit is reduced. It is also apparent that power savings will result from two virtual power supplies being replaced with one 232. However, it is not so apparent that the method and apparatus 200 described above can result in faster circuit operation. If desired, the savings in area and power may be sacrificed for speed. Greater speed is achieved by making the shared fet 232 larger. A larger fet 232 will power up more quickly. When data 216 is received at the gate of the shared fet 232, power will reach the drain of the fet 232 more quickly, thus allowing for faster output when a control signal 212, 210 arrives.

Figure 9:
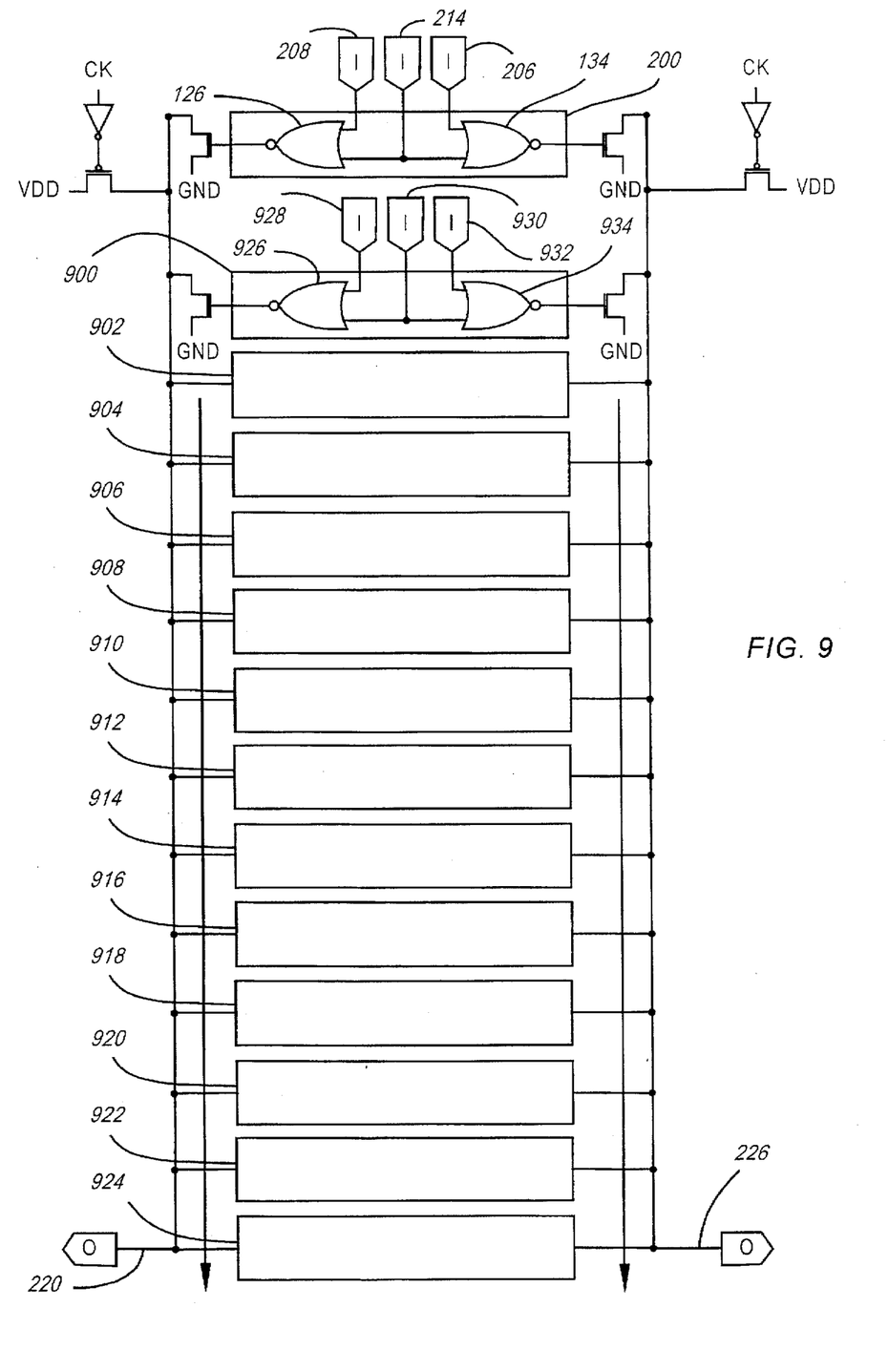
FIG. 9 is a schematic of numerous FIG. 1 dumper circuits sharing a common set of launch and retire buses.

The schematics of FIGS. 1 and 2 show the case wherein a single instruction may be dumped to the launch 220 or retire 226 bus. Within a functioning microprocessor, a number of instructions may in fact be dumped to the launch 220 and retire 226 buses, and a plurality of dumper circuits 200, 900-924 such as the one 200 pictured in FIG. 1 may share the launch 220 and retire 226 buses (see FIG. 9). Each dumper circuit 200, 900-924 is responsive to independent control lines 208, 206, 928, 932 and data inputs 214, 930, but such inputs are only shown in two of the FIG. 9 dumper circuits 200, 900. As in FIG. 1, each logic gate 126 in a single dumper circuit 200 of FIG. 9 must be operationally exclusive to its companion logic gate 134. Furthermore, each logic gate 126 connected to the launch bus 220 must be operationally exclusive to other logic gates 926 connected to the same bus 220. The same condition must exist among the logic gates 134, 934 connected to the retire bus 226.

Figure 6:
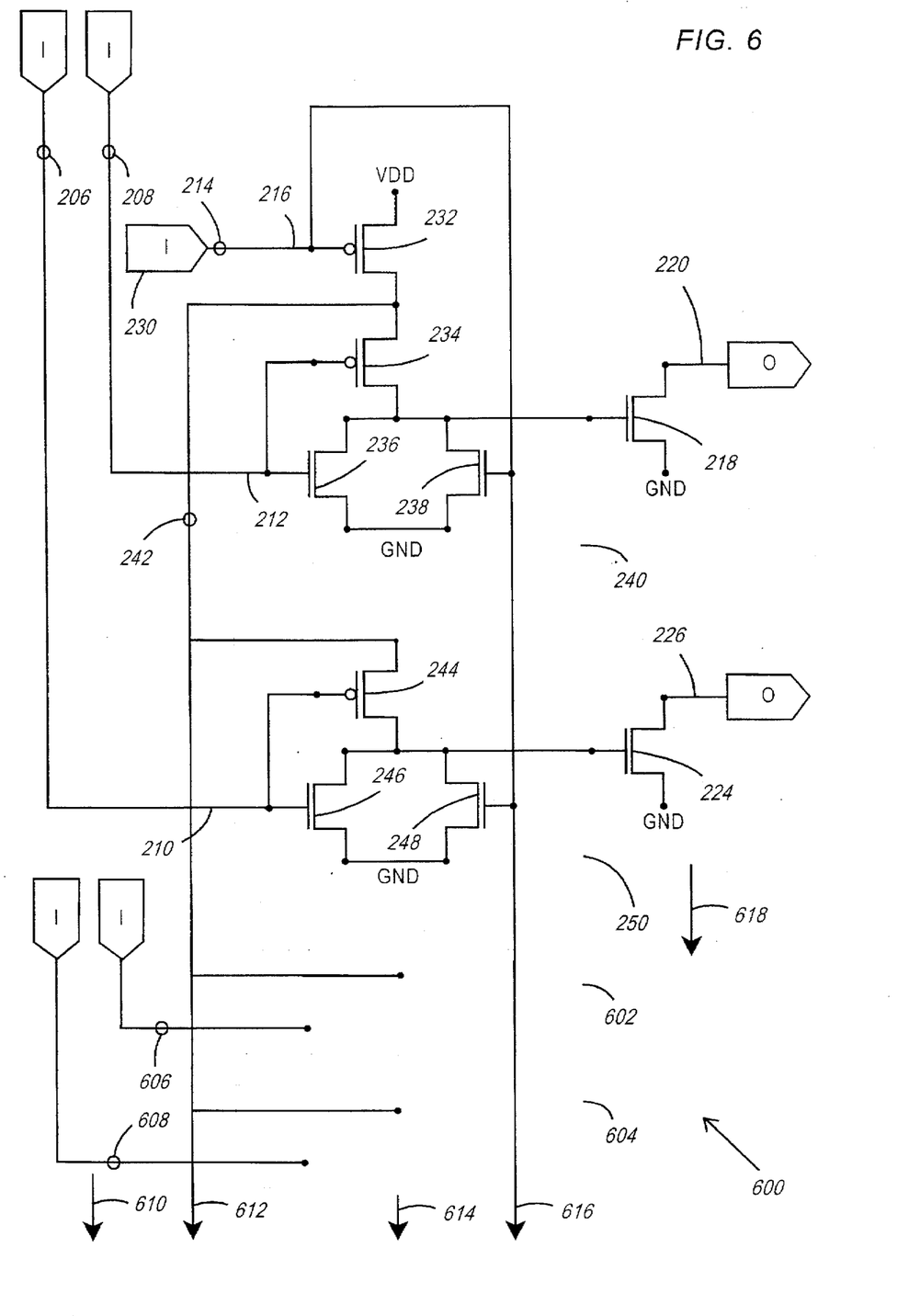
FIG. 6 is a fet level schematic of a dumper circuit comprising a large number of logic gates.

The inventor has also conceived that a shared fet 232 may replace a plurality of similar fet structures 232. Application of the method and apparatus disclosed herein is not limited to the case of two operationally exclusive logic gates 126, 134. FIG. 6 shows a dumper circuit 600 which is similar in many respects to the circuit 200 of FIG. 2. However, additional NOR gates have been implemented using additional partial logic gate structures 602, 604, 614. Each partial logic gate structure 602, 604, 614 relies 612, 616 on the shared fet 232 of the single complete logic gate 240. The number of logic gates which can share the shared fet 232 is only limited by such factors as 1) the availability of power, 2) the parasitic resistance/capacitance components of lengthy wire routings, and 3) the requirement that each logic gate operate to the exclusion of all other logic gates relying on the shared fet 232. Control lines 606, 608, 610 for the additional logic gates of FIG. 6 are shown. These control lines 606, 608, 610 send signals to the exclusion of each other, and to the exclusion of other control lines 206, 208. The outputs of the additional logic gates may be tied to the existing launch 220 and retire 226 buses, or may be tied to additional independent buses 618.

A second preferred embodiment of a dumper circuit 800 is shown in FIGS. 7 & 8. In FIG. 7, the two NOR gates 126, 134 of FIG. 1 have been replaced with NAND gates 704, 712. The NAND dumper circuit 800 of FIG. 7 largely mirrors the NOR dumper circuit 200 of FIG. 1, wherein pfets 232, 234, 244 have been replaced with nfets 838, 836, 848, and nfets 236, 238, 246, 248 have been replaced with pfets 832, 834, 844, 846.

An input 708, 716 of each logic gate 704, 712 is connected to a control line 808, 806. The two control lines 808, 806 are once again synchronized with a clock signal 300 (FIG. 3) and are timed to insure exclusive operation of the two logic gates 704, 712.

The output 710, 718 of each NAND gate 704, 712 is connected to a bus 820, 826. Again, one of the NAND gates 704 is connected to a launch bus 820 via an nfet 818, and the other NAND gate 712 is connected to a retire bus 826 via an additional nfet 824.

Data 816 representing the instruction to be dumped appears at a shared data input 706/714 of the NAND gates 704, 712. The data 816 is received by the shared data input 706/714 via a data line 814 connected to a latch 702. The latch 702 is capable of storing an instruction until it can be launched or retired. The latch is set by conventional means 700.

The NAND dumper circuit 800 is pictured in greater detail in FIG. 8. The NAND gate 704, 840 which is used to dump an instruction to the launch bus 820 is implemented with fets 832, 834, 836, 838 using standard NAND architecture (two parallel pfets 832, 834 connected to two series nfets 836, 838 between power and ground). Data 816 received by the NAND gate's data input 706 drives the gate of the series nfet 838 connected to ground (GND), causing the nfet 838 to conduct. The drain of the conducting nfet 838 serves as a virtual ground for the second series nfet 836. When data 816 is present at the gate of the first series nfet 838, and a control signal 812 (HI signal) is received by the second series nfet 836, the launch bus 820 is pulled LO by pulldown fet 818, and an instruction dump occurs.

The NAND gate 712 used to dump an instruction to the retire bus 826 is implemented as a partial NAND fet structure 850 in FIG. 8. The partial structure 850 comprises a series nfet 848 which is connected to two parallel pfets 844, 846 tied to power (VDD). Data 816 is input to the partial NAND fet structure 850 via a connection 842 to the grounded series nfet 838 of the complete NAND structure 840. Since exclusivity of operation between the NAND gates 704, 712 is ensured by the signals 812, 810 received over the control lines 808, 806, the nfet 838 connected to ground may be shared between the NAND logic gates 704, 712, and the second NAND gate 712 does not need to be implemented as an independent structure. The shared nfet 838 will serve as a virtual ground for both the partial NAND structure 850, and the similar structure contained in the complete NAND structure 840.

While illustrative and presently preferred embodiments of the invention have been described in detail herein, it is to be understood that the inventive concepts may be otherwise variously embodied and employed and that the appended claims are intended to be construed to include such variations except insofar as limited by the prior art. For example, the disclosed method and apparatus for sharing a fet 232 between a plurality of operationally exclusive logic gates 126, 134 have been presented with respect to dumper circuits 200. However, it is believed that use of the disclosed method and apparatus is advantageous wherever similar fets or fet structures may appear in two or more operationally exclusive logic gates. First input signals received at first inputs to a plurality of logic gates may ensure exclusivity of operation between the logic gates, and a second signal, received at an input shared by the plurality of logic gates, may be applied to a shared fet.

What is claimed is:

1. A circuit for dumping a computer instruction to one of a plurality of buses, comprising:

a) a plurality of buses comprising at least first and second buses;

b) a plurality of dumper circuits;
   wherein each dumper circuit comprises at least first and second logic gates;
   wherein for each dumper circuit, an output of the first logic gate is connected to the first bus, and an output of the second logic gate is connected to the second bus;
   wherein each dumper circuit comprises at least first and second control inputs and a data input; and
   wherein for each dumper circuit, the data input is coupled to a fet which is shared between the first and second logic gates of the dumper circuit;

c) a plurality of control lines comprising subsets of operationally exclusive control lines:
   wherein each dumper circuit receives a unique one of the subsets of operationally exclusive control lines;
   wherein for each dumper circuit, the unique subset of operationally exclusive control lines received by the dumper circuit comprises at least first and second control lines which are respectively received by the first and second control inputs of the dumper circuit; and d) a plurality of data latches for storing bits of a computer instruction;
   wherein the data input of each dumper circuit receives an output of a unique one of the plurality of data latches.

2. A circuit as in claim 1, wherein the first bus is a launch bus, and the second bus is a retire bus.

3. A circuit as in claim 1, wherein:

a) the plurality of buses comprises an additional N buses;

b) each dumper circuit comprises an additional N logic gates;

c) outputs of the additional N logic gates are respectively connected to the additional N buses;

d) each dumper circuit comprises an additional N control inputs;

e) for each dumper circuit, the fet to which the data input is coupled is also shared between the additional N logic gates of the dumper circuit; and f) for each dumper circuit, the unique subset of control lines received by the dumper circuit comprises an additional N control lines which are respectively received by the additional N control inputs of the dumper circuit.

4. A circuit as in claim 1, wherein each of the logic gates is a NAND gate, and each of the shared fets is an nfet.

5. A circuit as in claim 1, wherein each of the logic gates is a NOR gate, and each of the shared fets is a pfet.

* * * * *